United States Patent [19]
Link et al.

[11] Patent Number: 5,526,164
[45] Date of Patent: Jun. 11, 1996

[54] OPTICAL TRANSMISSION SYSTEM COMPRISING A LASER DIODE

[75] Inventors: Thomas Link, Nürnberg; Dieter Will, Lauf a.d. Pegnitz; Hubert Karl, Neumarkt, all of Germany

[73] Assignee: U.S. Philips Corporation, New York, N.Y.

[21] Appl. No.: 246,030

[22] Filed: May 19, 1994

[30]  Foreign Application Priority Data

May 19, 1993 [DE]  Germany .................... 43 16 811.6

[51] Int. Cl.⁶ .................................................. H04B 10/06
[52] U.S. Cl. ................................................... 359/187
[58] Field of Search ...................... 359/187, 180

[56]  References Cited

U.S. PATENT DOCUMENTS

| | | | |
|---|---|---|---|
| 4,277,846 | 7/1981 | Chen | 359/187 |
| 5,153,765 | 10/1992 | Grunziger | 359/180 |
| 5,309,269 | 5/1994 | Shibao | 359/187 |
| 5,311,005 | 5/1994 | Visocchi | 359/187 |
| 5,317,443 | 5/1994 | Nishimoto | 359/187 |
| 5,373,387 | 12/1994 | Bosch | 359/187 |

FOREIGN PATENT DOCUMENTS

| | | | |
|---|---|---|---|
| 0052536 | 5/1982 | European Pat. Off. | 359/187 |
| 3817836 | 5/1988 | Germany | 359/187 |
| 0136932 | 6/1987 | Japan | 359/187 |
| 0151039 | 7/1987 | Japan | 359/187 |
| 2187055 | 8/1987 | United Kingdom | 359/187 |

*Primary Examiner*—Leslie Pascal
*Attorney, Agent, or Firm*—Leroy Eason

[57]  ABSTRACT

An optical transmitter for transmission of data signals includes a laser diode producing optical radiation and a photodiode which in response thereto produces a photocurrent the mean value of which corresponds to the mean optical power of the radiation. Based on the photocurrent a control circuit derives parameters for controlling the laser current so as to compensate for changes in the characteristic line thereof, which line is the relation between optical power and laser current. Such parameters include a modulation current setting parameter $U_{mod}$ and a bias current setting parameter $U_0$. The bias current is controlled to remain at or above the dip in the characteristic line at relatively low current levels.

4 Claims, 2 Drawing Sheets

OPTICAL TRANSMISSION SYSTEM COMPRISING A LASER DIODE

BACKGROUND OF THE INVENTION

The invention relates to an optical transmission system comprising a laser diode and, coupled to the laser diode, a photodiode whose photocurrent is applied to a control circuit for adjusting the optical power of the laser diode, which control circuit generates a first and a second setting parameter for respectively setting a modulation current and a bias current, and comprising an arrangement for determining a differential quotient of the optical power and the laser current flowing through the laser diode. The invention particularly relates to an optical transmitter for such a transmission system.

Such optical transmitters are used, for example, in cable digital transmission systems in which the transmission of information signals is effected via light waveguides.

From German Patent Application DE 38 17 836 A1 laid open to public inspection is known an optical transmitter comprising a laser diode, which transmitter comprises a control circuit for adjusting the optical power of the laser diode. Adjustment of the optical power is necessary because the characteristic line of the laser diode relating optical power to current, changes with ageing processes. In the event of an aged laser diode the dip in the characteristic line is shifted towards higher laser diode currents, and the slope (or "steepness") of the line is reduced especially for laser diode currents in the region above the dip. The laser diode current at the dip of the characteristic line is referenced the threshold current. In said state of the art publication a photodiode is used as a monitor diode which converts a pulse-shaped laser diode optical signal, on which a pulse-shaped pilot signal is superimposed, into a photocurrent. This photocurrent is applied to the control circuit which comprises two analog adjusting branches, one for maintaining the average optical power and the optical power in a state of rest at a constant level, and the other for adjusting a bias current consisting of only a D.C. portion of the laser current above the threshold current level. The laser diode generates the rest-state optical power when it is triggered only by the bias current. The threshold current must not be greater than the bias current, so that the adjusting region of the laser diode will be situated above the dip of its characteristic line. Distortions of the light signal of the laser diode are thereby avoided. The control circuit is based on a linearized model of the characteristic line of the laser diode. The ageing process of the laser diode may, however, cause an overproportional flattening of the characteristic line of the laser diode.

SUMMARY OF THE INVENTION

It is an object of the invention to provide a transmission system of the type defined in the opening paragraph, which functions correctly even with age-susceptible overproportional flattening of the characteristic line of the laser diode, the optical power in a state of rest and the maximum optical power being maintained at a constant level.

This object is achieved in that the control circuit is provided with means for producing the modulation current setting parameter $U_{mod}$ from an adjusting parameter $U_m$ derived from the mean value of the photocurrent, and means for producing the bias current setting parameter $U_0$ from the measured differential quotient, $U_0$ of the mean value of the optical power and the mean value of the laser diode current.

An overproportional flattening of the characteristic line of the laser diode caused by ageing or temperature denotes an overproportional reduction of the differential quotient of the characteristic line especially in the range of the maximum optical power of the laser diode. To maintain nevertheless both the minimum and maximum optical power of the laser diode at a constant level, which corresponds to keeping the average optical power and the extinction coefficient constant, requires a control circuit. The extinction coefficient is the ratio of the optical power in a state of rest to the maximum optical power. Furthermore, the control circuit is to guarantee that the bias current of the laser diode determining the high optical power of the laser diode does not drop below the threshold current of the characteristic line of the laser diode, because this would lead to distortions in the output signal of the laser diode. By comparing the setting parameter $U_m$ derived from the mean value of the photocurrent with a predetermined nominal value, $U_{m,doll}$ the controller included in the control circuit maintains the mean optical power of the laser diode at a constant level. For this purpose, the controller adjusts the setting parameter $U_m$ for the or modularion current, which causes the pulse-shaped portion of the light signal carrying the information to be generated. For determining the bias current a linearized model of the characteristic line of the laser diode is applied. The measured differential quotients over the range of the maximum optical power of the laser diode and the operating point of the laser diode then determine the bias current to be formed. The operating point of the laser diode is situated around the mean value of the laser diode current and a given mean value of the optical power. Advantageously, such a control circuit maintains both the mean optical power and the extinction coefficient at a constant level as a result of the cooperation of the controller and the part of the control circuit determining the bias current. When the characteristic line of the laser diode becomes flatter, the bias current is additionally increased, so that despite a shift of the threshold current to higher laser diode currents with ageing of the laser diode, the bias current continues to be larger than the threshold current.

A further embodiment of the invention is characterized in that the control circuit estimates the mean value of the laser diode current from the sum of the mean value of the modulation current and a previously determined and stored bias current value.

The mean value of the laser diode current, which corresponds to the laser diode current at the operating point on the characteristic line of the laser diode, cannot be derived directly from the photocurrent generated by the photodiode operating as a monitor diode. For this reason it is necessary that an estimation of the mean value of the laser diode current be made from other parameters available in the control circuit. From the characteristic line of the laser diode it is apparent that the mean value of the laser diode current is the sum of the mean value of the modulation current and the bias current. If a monitoring period which is very large compared with the period of a pulse or of a pulse pause of the data signal generated by the laser diode and determined by the modulation current is started from, the number of pulses is substantially equal to the number of pulse pauses if, as is the case here, a statistically uniform distribution can be started from. There is thus a very simple computation of the mean value of the modulation current, as being half the amplitude of the modulation current. The bias current value, which also is necessary for computing the mean value of the laser diode current cannot be derived from an actual value of the control circuit at the determining instant in question because the bias current must first be derived from the mean value of the laser diode current. For this reason it is advantageous to provide a memory in which a bias current value that has already been determined is stored. At one of the next determining instants a bias current value stored in this manner is used for determining the mean value of the laser diode current. Thereafter the memory is updated with the newly computed bias current value.

In a further embodiment of the invention the control circuit is provided for using the first setting parameter available on the output of a controller to determine the bias current.

To determine the mean value of the laser diode current, which is necessary for determining the bias current, the value of the actual modulation current or half the value of the actual modulation current is to be available. The setting parameter available on the output of the controller is directly proportional to the modulation current. The actual value of the modulation current can then be simply determined from this setting parameter.

The invention is furthermore advantageously arranged in that modulation means are provided for modulating the laser current with a pilot current. The control circuit determines the differential quotient by computing a measuring parameter which corresponds to the amplitude of the component of the photocurrent whose frequency is equal to the fundamental frequency of the pilot current.

To determine the bias current it is necessary to have the value of the differential quotient or slope of the characteristic line of the laser diode in the range of the maximum optical power available. For this reason there is superimposed on the high-frequency data signal of the laser diode a low-frequency pilot signal whose amplitude is much smaller than that of the data signal. The fundamental frequency of the pilot signal lies in the passband of the photodiode, which has a low-pass mode. The frequency component of the photocurrent that corresponds to the fundamental frequency of the pilot signal is selected by filter means. That frequency component is a measure of the differential quotient or slope of the characteristic line of the laser diode in the range of maximum optical power of the laser diode.

A further embodiment of the invention is characterized in that the modulation current setting parameter $U_{mod}$ is also used setting the amplitude of the pilot current.

To avoid a mutilation of the data signal of the laser diode by the superimposed pilot signal and a consequent loss of data, it is necessary that the amplitude of the pilot signal be substantially smaller than the amplitude of the data signal. The pilot current producing the pilot signal is therefore to be much smaller than the modulation current producing the data signal. This is achieved in that the amplitudes of the pilot current and modulation current have a fixed relation to each other. In the present invention, the two currents are derived from the first setting parameter available on the output of the controller. The conversion factor of a converter, which converter produces the modulation current from the first setting parameter, is larger by a suitable factor than the conversion factor of another converter which produces the pilot current from the first setting parameter. The appropriate factors are easily realised as regards circuitry.

A further embodiment of the invention is characterized in that the circuit unit for producing the bias current setting parameter, is supplied at its inputs with the adjusting, measuring and modulation current setting parameters, and comprises a memory for storing at least one value of the bias current.

The bias current can be determined as described above by a single circuit unit which produces a bias current setting parameter once it has evaluated the supplied three input parameters and the stored bias current value. This setting parameter is proportional to the bias current to be determined.

Another possibility of advantageously arranging the invention is that a band-pass filtering, a demodulation and a subsequent low-pass filtering are provided to determine the measuring parameter from the photocurrent.

For deriving from the photocurrent a measuring parameter which represents a measure of the differential quotient of the characteristic line of the laser diode in the range of the maximum optical power, it is necessary to select the frequency portion of the photocurrent that corresponds to the fundamental frequency of the pilot signal and transform same to the baseband. The selection of this frequency portion of the photocurrent is advantageously performed by means of a band-pass filtering. The transformation into the baseband to produce a measuring parameter consisting only of a DC component is advantageously achieved by a demodulation and a subsequent low-pass filtering. The demodulation is performed, for example, by a 4-quadrant multiplier.

The invention is furthermore advantageous in that the controller and/or the circuit block are realised by a digital circuit.

Basically, there is a possibility of realising both a controller and a circuit block, producing the first and second setting parameters, in a single analog or digital circuit. Particularly realising the circuit block provided for producing the second setting parameter or for determining the bias current in a digital circuit is advantageous, because said scheme for determining the bias current can be easily modified. When a digital circuit is used for said circuit block it is advantageous to realise also a controller in this digital circuit when there is still unused computation capacity. In this manner the cost of analog circuitry can be reduced. Cost-effective circuitry is then obtained.

BRIEF DESCRIPTION OF THE DRAWINGS

Embodiments of the invention will be further explained with reference to the drawings in which.

DESCRIPTION OF THE PREFERRED EMBODIMENTS

Figure 1:
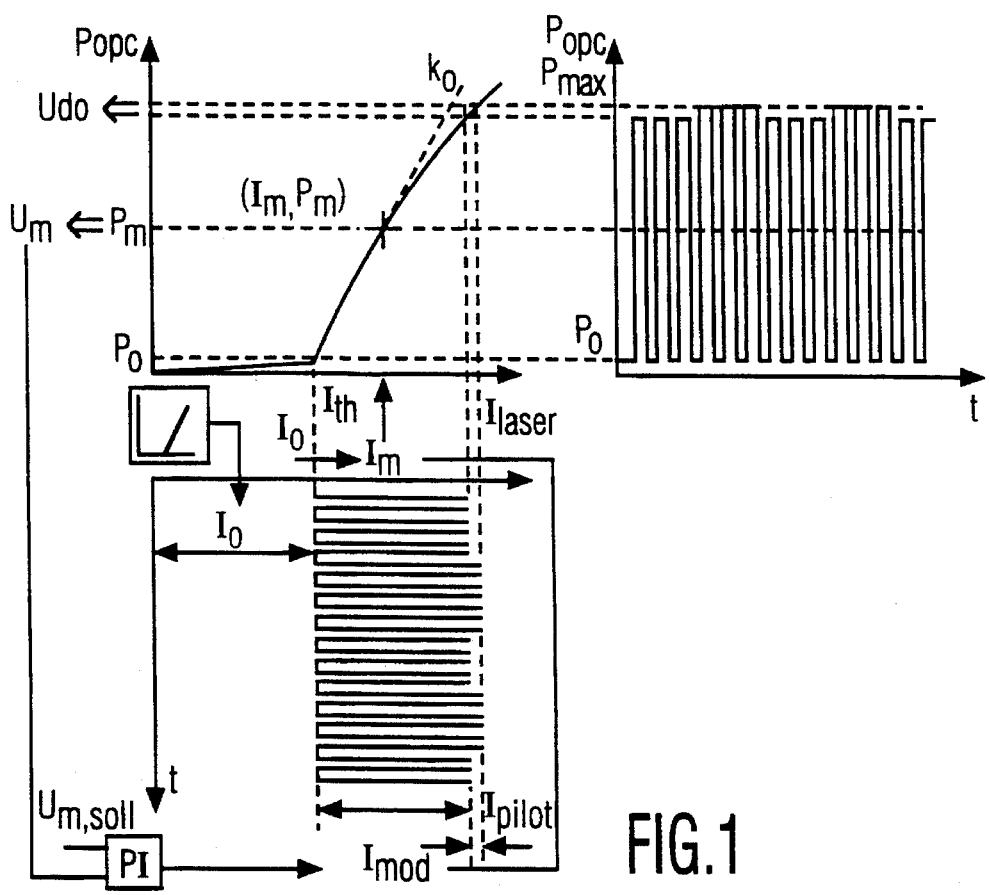
FIG. 1 shows a characteristic line of the laser diode with associated time-dependent variations of the laser current and of the optical power.

FIG. 1 shows a characteristic line of a laser diode. The laser current $I_{laser}$ is shown on the laser abscissa and the optical power $P_{opt}$ is shown on the ordinate. The characteristic line can be coarsely divided into two parts. The two parts meet at a dip of the characteristic line of at the threshold current $I_{th}$. The part of the curve for laser diode currents, which are smaller than the threshold current $I_{th}$ has only little or slope. The optical power $P_{opt}$ is negligibly small there. The other part of the curve, for laser diode currents exceeding the threshold current $I_{th}$, has considerably more slope. An operating point ($I_m$, $P_m$) is shown. The range of the characteristic line between the dip and this operating point can be well approximated by a straight line section. Above the operating point the characteristic line becomes distinctly flatter. This overproportional flattening occurs especially when the laser diode temperature rises or when the laser diode ages. With a rising temperature or with an ageing laser diode the slope of the overall characteristic line above the threshold current $I_{th}$ decreases. Furthermore, the threshold current $I_{th}$ increases.

Below the diagram of the characteristic line is shown a variation with time of the laser diode current $I_{laser}$ by way of example. The laser diode current $I_{laser}$ consists of a bias current $I_0$, a modulation current $I_{mod}$ and a pilot current $I_{pilot}$. The bias current $I_0$ is purely a DC current. It provides that the laser diode current $I_{laser}$ is always larger than the threshold current $I_{th}$. The modulation current $I_{mod}$ is in this case modulated with a high-frequency binary data signal whose frequency lies in the range above 140 MHz. The third component of the laser diode current $I_{laser}$ is the pilot current $I_{pilot}$. This pilot current is modulated with a digital pilot signal having a range of several kHz. As the modulation current $I_{mod}$ represents a binary signal so does the pilot current $I_{pilot}$. The two possible binary states "0" and "1" are represented by a zero modulation current and a maximum current, respectively. The transmission rate of the pilot current $I_{pilot}$ is in the present example 3.5 kHz. The amplitude of the pilot current $I_{pilot}$ is one-hundredth of the amplitude of the modulation current $I_{mod}$. For obvious reasons the pilot current $I_{pilot}$ is not shown true to scale compared with the modulation current $I_{mod}$.

To the right of the characteristic line of the laser diode is shown the variation with time of the optical power $P_{opt}$ corresponding to the laser diode current $I_{laser}$ described above. The variation with time of the optical power $P_{opt}$, which power depends on the characteristic line of the laser diode, represents a sequence of optical pulses on which, additionally, a DC portion $P_0$ (optical power in a state of rest) is superimposed. This DC portion $P_0$ is determined by the height of the bias current $I_0$. The height $P_{max}$ of the pulse is determined by the amplitudes of the modulation current $I_{mod}$ and of the pilot current $I_{pilot}$. For example, a logic 1 is represented by a pulse of height $P_{max}$, a logic zero is accordingly represented by a pulse pause having optical power $P_0$. The pulse height $P_{max}$ is determined by the amplitudes of the modulation current $I_{mod}$ and pilot current $I_{pilot}$.

Since the form of the characteristic line of the laser diode changes as a result of temperature increases or ageing processes as described above, an adjustment of the optical power $P_{opt}$ is necessary. For example, the DC portion $P_0$ and the height $P_{max}$ of the pulse of the optical power $P_{opt}$ are each to be adjusted to a constant value. This is equally important to enable an adjustment to a constant value of the mean value $P_m$ of the optical power $P_{opt}$ and of a so-called extinction coefficient which represents the ratio of $P_0$ to $P_{max}$.

A controller PI, whose inputs are supplied with a nominal value parameter $U_{m,soll}$ and an adjusting parameter $U_m$ which is proportional to the mean value $P_m$, is provided to adjust the mean value $P_m$. Depending on the difference between its input parameters, the PI controller readjusts the modulation current $I_{mod}$. With a modified characteristic line of the laser diode, also the bias current $I_0$ is readjusted. The bias current $I_0$ is then computed with the aid of a simplified model of the characteristic line of the laser diode, because it is impossible to have an exact measurement of the characteristic line of the laser diode while the laser diode is in operation. The simplified model of the characteristic line assumes that the optical power $P_{opt}$ becomes equal to zero when laser diode current $I_{laser}$ is smaller than or equal to the threshold current $I_{th}$. For laser diode currents larger than the threshold current $I_{th}$ a linear characteristic line is plotted. This part of the characteristic line is determined by a slope $k_0$ and an operating point ($I_m$, $P_m$). The slope $k_0$ is equal to the slope differential quotient of the non-linearized characteristic line of the laser diode in the range of the optical power $P_{max}$. The mean value $P_m$ is fixed. This value is continuously readjusted by the controller PI while the laser diode is in operation. The current $I_m$ represents the mean value of the laser diode current $I_{laser}$. This value is computed or based on the sum of a stored bias current value $I_0$ and half the height of a current pulse of the modulation current $I_{mod}$. It is assumed here that the pilot current is negligibly small compared with the modulation current and that the period of time available for determining $I_m$ is long compared with the period of time of a pulse of the modulation current $I_{mod}$. Furthermore, it is assumed that the occurrence of the pulse or of a pulse pause respectively, of the modulation current $I_{mod}$ is equally probable.

Figure 2:
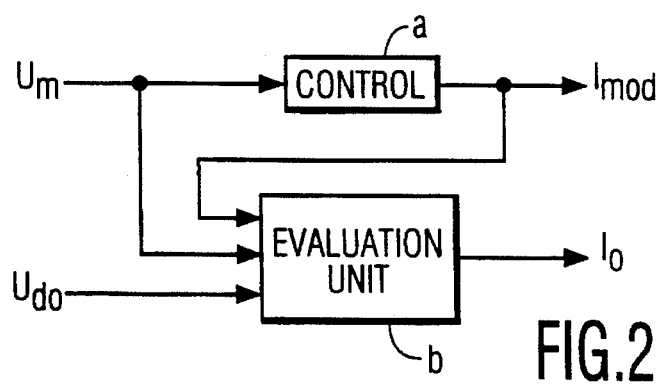
FIG. 2 shows a block circuit diagram of a control circuit used.

FIG. 2 shows the principle of an adjustment of the modulation current $I_{mod}$ and the bias current $I_0$. A circuit block a comprises a controller with an input which is supplied with the adjusting parameter $U_m$. This circuit block compares the adjusting parameter $U_m$ with a nominal value and based on such comparison determines the amplitude of $I_{mod}$. The inputs of a circuit block b are also supplied with the adjusting parameter $U_m$, a measuring parameter $U_{d0}$ and the output signal $I_{mod}$ of the circuit block at the circuit block b comprises an evaluation unit which determines the bias current on the basis of the three input parameters.

Figure 3:
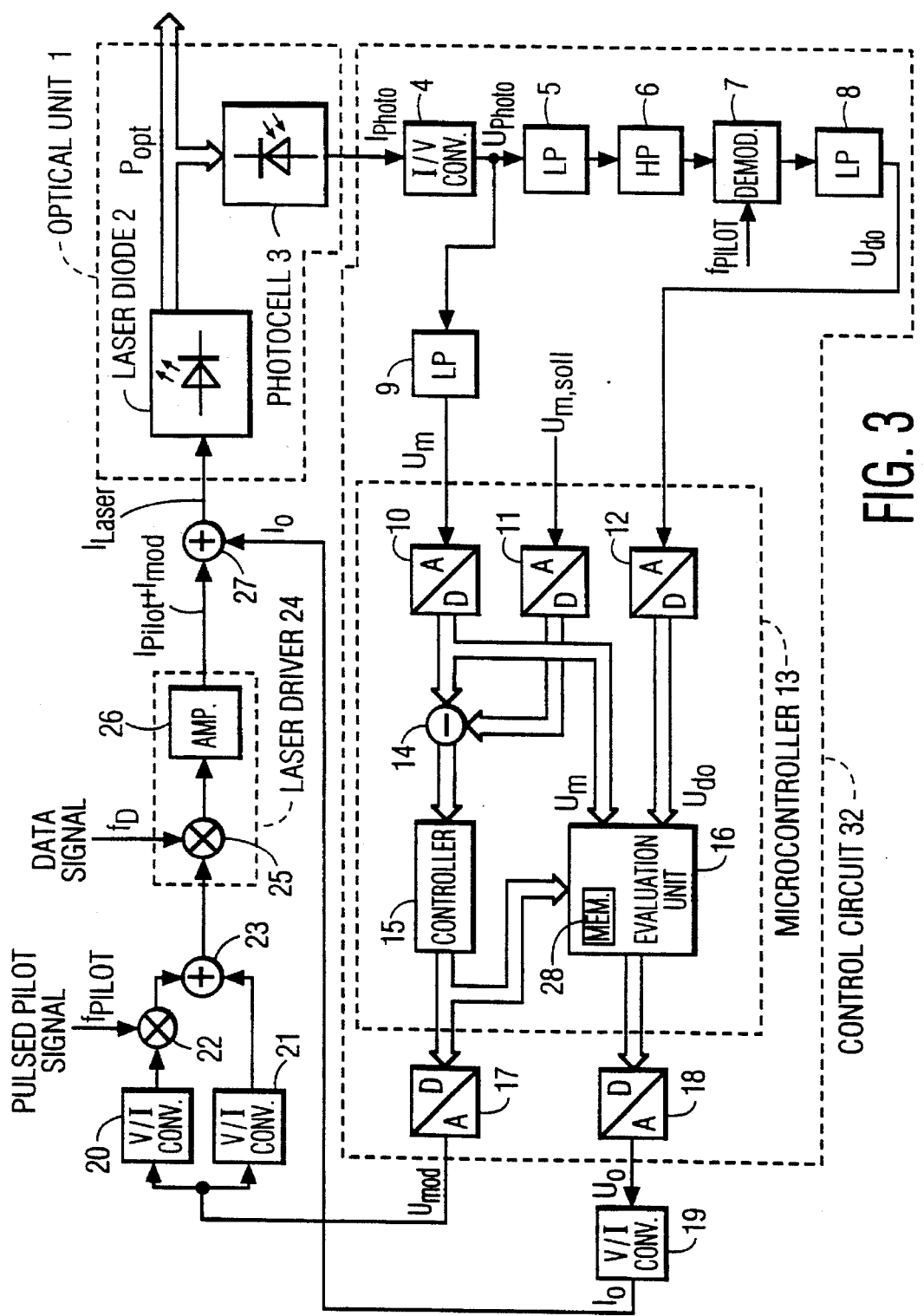
FIG. 3 shows a block circuit diagram of an optical transmitter having the characteristic features according to the invention.

FIG. 3 shows a block circuit diagram of an adjusted optical transmitter. Circuit block 1 comprises the optical unit part of the circuit arrangement. It is formed by a laser diode 2 producing light with the optical power $P_{opt}$, and a photodiode 3 coupled thereto and acting as a monitor diode. The photodiode 3 produces a photocurrent $I_{photo}$ which is proportional to the optical power $P_{opt}$. The photocurrent $I_{photo}$ is converted into a photovoltage $U_{photo}$ by a current-voltage converter 4. This photovoltage $U_{photo}$ is applied to a low-pass filter 9 on whose output is available a voltage $U_m$ which is proportional to the mean value of the photocurrent $I_{photo}$. The voltage $U_{photo}$ is furthermore applied to a low-pass filter 5 whose output is connected to the input of a high-pass filter 6. The limit frequency of the low-pass filter 5 lies at 100 kHz, the limit frequency of the high-pass filter 6 lies at 1 kHz. These two circuit elements have thus the function of a band-pass filter. The output signal of the high-pass filter 6 is applied to a demodulator (4-quadrant multiplier) 7. This demodulator demodulates the band-pass signal while utilizing the pilot frequency $f_{pilot}$. A low-pass filter 8 attenuates the high spectral portions of the demodulator output signal and produces its DC component as measuring parameter $U_{d0}$. The adjusting parameter $U_m$, a nominal value $U_{m,soll}$ and the measuring parameter $U_{d0}$ are applied to three inputs of a microcontroller 13. At the three inputs of the microcontroller 13 are arranged three analog/digital converters 10, 11, 12 which digitize the three input parameters. In the following like references are used for like digital and analog parameters. The microcontroller 13 comprises a subtracter 14 which forms the difference between $U_{m,soll}$ and $U_m$. This difference is applied to an input of a PI-controller 15. It is possible to use a different type of controller, for example, a PID-controller. The controller 15 produces a first setting parameter $U_{mod}$. The output of the controller 15 constitutes first output of the microcontroller 13. The microcontroller 13 further includes an evaluation circuit 16 which comprises a memory 28. Three inputs of this evaluation circuit 16 carry the parameters $U_{mod}$, $U_m$ and $U_{d0}$ in digitized form. They are further processed by the evaluation unit 16 to derive a second setting parameter $U_o$ in accordance with a computing operation still to be explained, which second parameter is available on a second output of the microcontroller 13.

The first setting parameter $U_{mod}$ is converted by a digital/analog converter 17 to an analog first setting parameter $U_{mod}$ (DC voltage). $U_{mod}$ is applied to an input of a voltage-current converter 20 whose output is coupled to the input of a multiplier 22. The multiplier 22 multiplies its input signal by a pulse-shaped binary pilot signal having frequency 3.5 kHz. The output signal of the multiplier 22 is fed to a first input of the adder 23. A voltage-current converter 21 is arranged in a parallel combination with the voltage-current converter 20 and the multiplier 22. This converter 21 converts the DC voltage $U_{mod}$ to a DC current which is considerably larger (here by a factor of 100) than the DC current flowing from the output of the voltage-current converter 20. The DC current thus produced is fed to a second input of the adder 23. The sum current thus produced and flowing from the output of the adder 23 is applied to a laser driver 24. This laser driver comprises, in essence, a further multiplier 25 and an amplifier 26. The multiplier 25 multiplies the sum current by a pulse-shaped binary data signal having frequency $f_D$. The frequency $f_D$ in the present example lies in the range above 140 MHz. The sum of the pilot current $I_{pilot}$ and the modulation current $I_{mod}$ flows from the output of the laser driver 24. This sum is applied to an adder 27. The bias current $I_0$ coming from the output of a voltage-current converter 19 flows into a further input of the adder 27. The input of this voltage-current converter 19 is supplied with the second setting parameter $U_0$ which was converted from a digital to an analog signal by a digital/analog converter 18. The second setting parameter $U_o$ is proportional to the bias current $I_0$. The laser current $I_{laser}$ which drives the laser diode 2 flows from the output of the adder 27. The laser current $I_{laser}$ is formed by the sum of $I_{pilot}$, $I_{mod}$ and $I_0$.

When the optical transmitter is initially used in an optical communication system, the optical power in a state of rest $P_0$ and the power $P_{max}$ of the light pulses to be generated are set to the desired values by setting $U_{mod}$ and $I_0$ to suitable initial values. Fixed are thus the desired mean value of the optical power of the laser diode, which is then equal to $(P_0+P_{max})/2$ when there is a uniform distribution of pulses and pulse pauses, and also the corresponding extinction coefficient. The control circuit 32 maintains the optical power $P_{Opt}$ at a virtually constant level even when the characteristic line of the laser diode shows a flattened pattern in the case of ageing or temperature-dependent circumstances. The photocurrent $I_{photo}$ of the photodiode 3 coupled to the laser diode 2 is used for setting the bias current $I_0$ and the amplitude of the modulation current $I_{max}$. Since the photodiode 3 has a low-pass filtering effect and its limit frequency is smaller than the frequency $f_D$ of the data signal, nothing can be learned with respect to $P_0$ and $P_{max}$ on the basis of the photocurrent $I_{photo}$. Therefore, a pilot signal is superimposed on the output signal of the laser diode. This pilot signal is produced from a pilot current $I_{pilot}$ having frequency $f_{pilot}$ which is below the low-pass limit frequency of the photodiode. The pilot frequency $f_{pilot}$ is thus not situated in the inhibit region of the photodiode 3. A first and a second setting parameter $U_m$, $U_{d0}$ respectively, can be derived from the photocurrent $I_{photo}$, as described above. $U_m$ is proportional to the mean value of the photocurrent $I_{photo}$ and thus also proportional to the mean value $P_m$ of the optical power $P_{Opt}$ of laser diode 2. $U_{d0}$ is proportional to the amplitude of the component of the photocurrent $I_{photo}$ whose frequency is equal to the fundamental frequency of the pilot current $I_{pilot}$, and thus also proportional to the slope or differential quotient $k_0$ of the characteristic line of the laser diode within the range of $P_{max}$.

The desired mean optical power $P_m$ of the laser diode is set with the nominal value $U_{m,soll}$. By readjusting the setting parameter $U_{mod}$, which determines the amplitude of the modulation current $I_{mod}$, the controller 15 maintains $P_m$ at a constant level.

In the following there will be shown how the bias current $I_0$ is formed from the three input parameters $U_{mod}$, $U_m$ and $U_{d0}$ of evaluation unit 16 or, respectively, from the parameters $I_{mod}$, $I_{photo}$ and $k_0$ proportional thereto. An estimate of the mean value $I_m$ of the laser current $I_{laser}$ can be computed from $$I_m = I_{0,alt} + I_{mod}/2 \tag{1}$$

where $I_{0,alt}$ represents a value stored in memory 28 of a previously computed bias current $I_0$. $I_{mod}$ is directly derived from the setting parameter $U_{mod}$ while a proportionality factor is taken into account. The slope or differential quotient, $k_0$ is obtained from $$k_0 = k(U_{d0}/U_{mod}) \tag{2}$$

where $U_{d0}$ is proportional to the slope or to the differential quotient $k_0$ of the characteristic line of the laser diode with maximum optical power $P_{max}$. The gain factors or attenuation factors respectively, of control circuit 32 are taken into account in factor k. The setting parameter $U_{mod}$ is to play a role in the computation of $k_0$, because the amplitude of the pilot current $i_{pilot}$ is not constant, but is derived from $U_{mod}$. When the linearized model of the characteristic line of the laser diode is used, the threshold current $I_{th}$ is:

$$I_{th} = I_m - P_m/k_0 \tag{3}$$

The mean optical power $P_m$ is then determined by the input parameter $U_m$ of the microcontroller 13. The bias current $I_0$ finally results in $$I_0 = I_{th} + P_0/k_0 \tag{4}$$

The optical power in a state of rest $P_0$ is a given constant parameter. $I_{th}$ and $k_0$ are computed from formulas (1) to (3).

When the characteristic line of the laser diode shows a flattened pattern due to temperature or ageing conditions, first the fast responding controller 15 adjusts the first setting parameter $U_{mod}$ or the modulation current $I_{mod}$ to a high level to keep the mean predetermined optical power $P_m$ at a constant level. The evaluation unit 16 increases the bias current $I_0$ in accordance with equations (1) to (4). In this manner an increase of the mean value $I_m$ of the laser diode current is obtained by increasing the modulation current $I_{mod}$ in accordance with equation (1). According to equation (3) this leads to a higher value found when computing the threshold current $I_{th}$. The increase of the summand $P_m/k_0$ by the reduced $k_0$ is overcompensated. With this result equation (4) leads to an increase of $I_0$. Although a flattening of the characteristic line of the laser diode is linked with an increase of the threshold current $I_{th}$, the bias current $I_0$ may be avoided becoming smaller than the threshold current $I_{th}$. Distortions of the output signal of the laser diode are avoided. In this manner the control circuit 32 furthermore guarantees that the mean value $P_m$ and the extinction coefficient of the optical power $P_{Opt}$ remain substantially constant.

Figure 4:
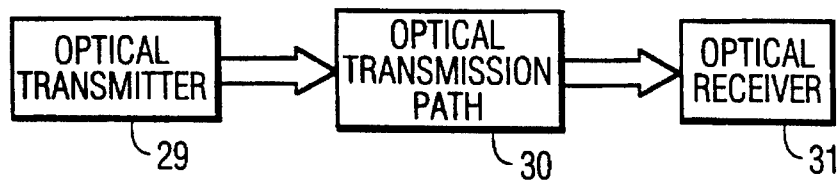
FIG. 4 shows a block circuit diagram of a transmission system comprising an optical transmitter as shown in FIG. 3.

FIG. 4 shows an optical transmission system. An optical transmitter 29 is arranged whose structure and functioning have been described in FIGS. 1 to 3. Furthermore, a light waveguide transmission link 30 is provided used for transmitting the optical signals produced by the transmitter 29. At the other end of the transmission path 30 there is provided an optical receiver 31 for receiving the signals.

We claim:

1. An optical transmitter for transmission of data signals, comprising:

a laser diode for producing pulsed optical radiation in response to a current supplied thereto which includes a laser bias current $I_0$ and a laser modulation current $I_{mod}$, the laser modulation current being modulated by said data signals; the laser diode having a characteristic line relating the current supplied thereto to the optical power of the radiation produced thereby;

a photodiode responsive to the radiation from the laser diode to produce a photocurrent having a mean value which corresponds to a mean value of the optical power of said radiation; and a control circuit coupled to said photodiode to receive said photocurrent and derive therefrom a first setting parameter $U_{mod}$ for controlling the modulation current $I_{mod}$ of the laser diode, said first setting parameter being based on an adjustment parameter $U_m$ which corresponds to the mean value of said photocurrent; and a second setting parameter $U_0$ for controlling the bias current $I_0$ of the laser diode, said second setting parameter being based on (i) a measuring parameter $U_{d0}$ which corresponds to the slope $k_0$ of the characteristic line of the laser diode, (ii) said adjustment parameter $U_m$, and (iii) said first setting parameter $U_{mod}$;

said slope $k_0$ being a differential quotient of the mean optical power of said radiation and a mean value of the current supplied to the diode laser.

2. An optical transmitter as claimed in claim 1, wherein derivation by said control circuit of said second setting parameter $U_0$ includes calculation of an estimated mean value $I_m$ of the laser diode current based on the sum of the mean value of said modulation current $I_{mod}$ and a stored previously calculated value of said bias current $I_0$.

3. An optical transmitter as claimed in claim 1, wherein the laser modulation current $I_{mod}$ is further modulated by a pilot current of lower frequency than said data signals, and said measuring parameter $U_{d0}$ corresponds to the magnitude of a component of said photocurrent which corresponds to said pilot current modulation of the laser modulation current.

4. An optical transmitter as claimed in claim 1, wherein said control circuit comprises a evaluation circuit means for receiving (i) the first setting parameter $U_{mod}$, (ii) the adjustment parameter $U_m$, and (iii) the measuring parameter $U_{d0}$, and on the basis of said parameters calculating a value of the bias current $I_0$, and storing said calculated value of the bias current in a memory comprised in said evaluation circuit means.

* * * * *